(12) United States Patent
Beyer et al.

(10) Patent No.: US 7,504,287 B2
(45) Date of Patent: Mar. 17, 2009

(54) METHODS FOR FABRICATING AN INTEGRATED CIRCUIT

(75) Inventors: Sven Beyer, Dresden (DE); Kamatchi Subramanian, Poughkeepsie, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/689,764

(22) Filed: Mar. 22, 2007

(65) Prior Publication Data

US 2008/0233738 A1  Sep. 25, 2008

(51) Int. Cl.
 *H01L 21/335* (2006.01)
 *H01L 21/336* (2006.01)
 *H01L 21/44* (2006.01)
 *H01L 21/4763* (2006.01)

(52) U.S. Cl. ............... 438/142; 438/197; 438/598; 438/618; 438/620; 438/622; 438/624; 438/631; 438/633; 438/634; 438/637; 438/639; 438/642; 438/643; 438/645; 438/652; 438/653; 438/674; 438/675; 257/E21.577

(58) Field of Classification Search ......... 438/620, 438/621, 142
See application file for complete search history.

(56) References Cited

U.S. PATENT DOCUMENTS

| | | | | |
|---|---|---|---|---|
| 2002/0111014 A1* | 8/2002 | Jeng et al. | ............... | 438/631 |
| 2007/0082476 A1* | 4/2007 | Kawahara et al. | ............ | 438/618 |
| 2007/0134909 A1* | 6/2007 | Klee et al. | ............... | 438/620 |
| 2007/0238238 A1* | 10/2007 | Sun et al. | ............... | 438/199 |
| 2008/0008969 A1* | 1/2008 | Zhou et al. | ............... | 430/313 |

* cited by examiner

*Primary Examiner*—Hsien-ming Lee
*Assistant Examiner*—Kevin A. Parendo
(74) *Attorney, Agent, or Firm*—Ingrassia, Fisher & Lorenz, P.C.

(57) ABSTRACT

A method is provided for fabricating a semiconductor device which includes a first contact point and a second contact point located above the first contact point. A first material layer is conformally deposited over the contact points, and a second material layer is deposited. A photoresist layer is applied and patterned to leave remaining portions. The remaining portions are trimmed to produce trimmed remaining portions which overlie eventual contact holes to the contact points. Using the trimmed remaining portions as an etch mask, exposed portions the second material layer are etched away to leave sacrificial plugs. The sacrificial plugs are etched away to form contact holes that reach portions the first material layers. Another etching step is performed to extend the contact holes to produce final contact holes that extend to the contact points.

15 Claims, 8 Drawing Sheets

METHODS FOR FABRICATING AN INTEGRATED CIRCUIT

TECHNICAL FIELD

The present invention generally relates to integrated circuits and to methods for their fabrication, and more particularly relates to methods for forming contact holes and contacts used in such integrated circuits.

BACKGROUND

Semiconductor devices, such as integrated circuits, are generally fabricated by the repeated application of a photolithographic process. A photosensitive material is applied to the surface of a semiconductor substrate, which may include layers of dielectric materials, polycrystalline silicon, and various metals. A radiation source is used to transfer the pattern of a lithographic mask or reticle onto the photosensitive material. The patterned photosensitive material is then used as a lithographic mask to process the semiconductor substrate or at least one of the layers on the substrate. The lithographic mask may be used, for example, as an etch mask or as an ion implantation mask.

For example, when fabricating MOS transistors one step involves forming contact holes or openings through various layers of material to the gate electrode and source and drain regions. To form such contact holes or openings, a layer of photoresist can be spin coated on the surface of a layer of dielectric material. The photoresist layer is patterned by exposing certain parts of the photoresist layer to light. Notably, there are two types of photoresist: negative photoresist and positive photoresist. When a negative photoresist layer is used, the parts of the negative photoresist layer which are not exposed to light can be washed off by wet chemical treatment; when a positive photoresist layer is used the exposed parts of the positive photoresist layer are washed away.

Once the photoresist layer has been patterned, the remainder of the photoresist layer can serve as a lithographic contact mask. The lithographic contact mask covers most of the underlying dielectric material layer, but also includes small round openings at the locations of the future contacts. The portions of dielectric material layer underlying the small round openings can then be selectively etched in a manner that is highly unisotropic to the lithographic contact mask. Etching transfers the pattern of the lithographic contact mask into the portions of dielectric material layer that underlie the small round openings in the lithographic contact mask to thereby produce contact holes. The contact holes can have a diameter of approximately 70 nm. These contact holes are subsequently filled with a conductive material to form electrical contacts to contact regions of the gate electrode and source and drain regions.

As the number of individual devices incorporated in a semiconductor device increases, there is a growing need to decrease the minimum feature size, that is, the minimum width, the minimum space between individual elements of the devices, the minimum widths of holes or vias, and the like. As the minimum feature size decreases (e.g., as lines and spaces on the integrated circuit become smaller and more closely spaced), the wavelengths necessary to resolve the patterns becomes shorter and shorter. When the minimum feature size is less than the wavelength of the radiation source, it becomes increasingly difficult to adequately resolve the features because of diffraction and interference effects. Optical distortion causes a loss of the anticipated one-to-one correspondence between the image on the mask and the image created in the patterned photosensitive material. As such, there is a practical limit to the size of the features which can be resolved in the photoresist layer using conventional photolithography techniques. For example, as the minimum feature size reaches 45 nm or smaller, it becomes increasingly difficult to resolve small critical dimensions (CDs) for contact holes in the photoresist layer. This is particularly true for small contact holes that open to source and drain regions since these contact holes have to be squeezed between adjacent gate electrodes. In many cases, it becomes difficult to etch contact holes with a vertical profile, and the etch process must be designed to stop on contact regions of the gate electrode yet still open up contact holes to the source and drain regions which reside below the gate electrode. In other words, because the source and drain regions are below the polysilicon gate material over the gate electrode, the contact holes to the polysilicon gate material are generally not as deep as the contact holes to the source and drain regions. As such, the height of the contacts which need to be formed can vary and have different heights because contact points which need to be contacted lie in different planes.

While extreme ultraviolet (EVU) lithography and electron-beam lithography may be used to pattern photoresist with small feature sizes, such processes are complex and very expensive.

Accordingly, it is desirable to provide improved methods for fabricating semiconductor devices that have small feature sizes. In addition, it is desirable to provide methods for forming and etching small features, such as contact holes, through material layers, particularly where the features being etched have a critical dimension which is smaller than the wavelength of light, and hence can not be patterned in photoresist using conventional photolithography techniques. It is also desirable to provide improved methods for forming contact holes which have a relatively straight or vertical etch profile. It is also be desirable to provide improved methods for forming contact holes which exhibit the ability to stop etching at different depths or levels in a selective manner. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment, a method is provided for fabricating contact holes in semiconductor device which includes a first contact point and a second contact point located above the first contact point. A first material layer is conformally deposited over the contact points, and a second material layer is deposited. A photoresist layer is applied and patterned to leave remaining portions. The remaining portions of the photoresist layer are trimmed to produce trimmed remaining portions which overlie eventual contact holes to the contact points. Using the trimmed remaining portions as an etch mask, exposed portions the second material layer are etched away to leave sacrificial plugs. The sacrificial plugs are etched away to form contact holes that reach portions the first material layer(s). Another etching step is performed to extend the contact holes to produce final contact holes that extend to the contact points.

For example, in one exemplary embodiment, a method is provided for fabricating a semiconductor device. A source region and a drain region are formed in a semiconductor substrate, and a gate structure including a gate electrode is formed on the semiconductor substrate. The source region has a first contact point, the drain region has a second contact point, and the gate structure has a third contact point disposed in a plane above the first contact point and the second contact point. At least one first material layer is conformally deposited overlying an upper surface of semiconductor substrate and the gate structure, and at least one second material layer is deposited overlying the first material layer. A photoresist layer is applied over the second material layer, and patterned to leave remaining portions of the photoresist layer. The remaining portions of the photoresist layer are trimmed to produce trimmed remaining portions of the photoresist layer which overlie eventual contact holes to the first contact point, the second contact point, and the third contact point. Exposed portions the at least one second material layer are etched away using the trimmed remaining portions of the photoresist layer as an etch mask. The remaining portions of the at least one second material layer which remain after etching comprise sacrificial plugs. The sacrificial plugs are etched away to form contact holes that reach portions the first material layer(s). Another etching step is performed to each away portions of the at least one first material layer. This etching step extends the contact holes to produce final contact holes that extend to the first contact point, the second contact point, and the third contact point.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

FIGS. 1-16 illustrate, in cross section, MOS transistor 30 and method steps for its fabrication in accordance with various embodiments of the invention. Those of skill in the art will understand that transistor 30 is likely to be one of a large number of transistors that are interconnected in an integrated circuit. In these illustrative embodiments the exemplary MOS transistor is a P-channel MOS (PMOS) transistor, although similar method steps can be used to manufacture a N-channel MOS (NMOS) transistor as will be explained below. Likewise, similar method steps can used to manufacture complementary MOS (CMOS) circuits that include a plurality of NMOS and/or PMOS transistors with or without conventional MOS transistors, all coupled together to implement a desired integrated circuit. Many different integrated circuits (ICs) can be formed with the semiconductor device 30, and such ICs can include a large number of MOS transistors 30.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate (whether silicon or other semiconductor material).

Figure 1:
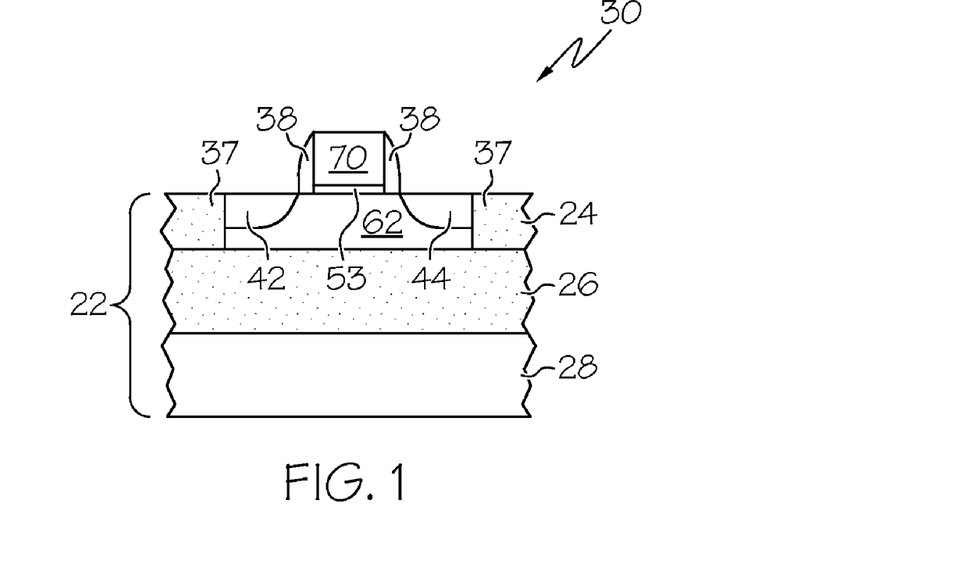
FIGS. 1-16 illustrate, in cross section, MOS transistor and method steps for its fabrication in accordance with various embodiments of the invention.

The initial steps in the fabrication of PMOS transistor 30 are conventional so the structure resulting from these steps is illustrated in FIG. 1, but the initial steps themselves are not shown and will not be described in detail. The PMOS transistor 30 is fabricated on a semiconductor substrate 22. The semiconductor substrate 22 can be either a bulk semiconductor material or a thin layer of semiconductor material on an insulating substrate (SOI) as illustrated in FIG. 1. Semiconductor layer 24 will hereinafter be referred to for convenience but without limitation as a silicon substrate or a semiconductor substrate although those of skill in the semiconductor art will appreciate that the semiconductor layer 24 can be a germanium layer, a gallium arsenide layer, or other semiconductor materials.

As illustrated in FIG. 1, the manufacture in accordance with an embodiment of the invention begins with providing a semiconductor structure 22 in and on which MOS transistors are fabricated. The semiconductor structure 22 is preferably a semiconductor-on-insulator (SOI) structure 22 which comprises at least one thin layer of semiconductor material 24 disposed on or over a buried oxide insulating layer 26 which, in turn, is supported by a carrier wafer or substrate 28 so that the buried oxide insulating layer 26 is disposed between the carrier wafer 28 and the semiconductor layer 24. In one embodiment, the semiconductor material layer 24 comprises a thin monocrystalline layer of silicon on the buried oxide insulating layer 26. The thin monocrystalline layer of silicon can be a silicon substrate having a (100) surface crystal orientation. The thin silicon layer preferably has a resistivity of at least about 1-35 Ohms per square. As used herein, the term "silicon layer" will be used to encompass the relatively pure silicon materials or lightly impurity-doped monocrystalline silicon materials typically used in the semiconductor industry as well as silicon admixed with small amounts of other elements such as germanium, carbon, and the like, as well as impurity dopant elements such as boron, phosphorus, and arsenic, to form a substantially monocrystalline semiconductor material. In one embodiment, the buried oxide insulating layer 26 can be, for example, a silicon dioxide layer, which preferably has a thickness of about 50-200 nm.

An optional protective oxide layer (not shown) can be deposited over the semiconductor layer 24 to protect the semiconductor layer 24 from damage and to help control implantation depth during subsequent implantation steps. In one embodiment, the protective oxide layer (not shown) can be, for example, a silicon dioxide layer, which preferably has a thickness of about 10-20 nm.

At least a surface portion of the semiconductor layer 24 can be impurity doped either with N-type conductivity determining impurities or P-type conductivity determining impurities depending on the conductivity type of the MOS transistor 30. In the PMOS embodiment illustrated in FIG. 1, the semiconductor layer 24 can be doped with N-type conductivity determining impurities to create an N-well region 62 in the semiconductor layer 24. Impurity doping can take place, for example, by the implantation and subsequent thermal annealing of dopant ions such as phosphorus. In an NMOS embodiment of the transistor (not illustrated in FIG. 1), the semiconductor layer can be doped with P-type conductivity determining impurities to create P-well regions (not shown) in the semiconductor layer 24. Impurity doping can take place, for example, by the implantation and subsequent thermal annealing of dopant ions such as boron and arsenic.

Once the N-well region 62 is formed, portions of the protective oxide layer (not shown) can be selectively removed, and trenches can be etched into the semiconductor layer 24 for the formation of dielectric isolation regions (not shown) between adjacent memory cells. For example, the memory cell 30 can be electrically isolated from other memory cells (not shown) by a dielectric isolation region (not shown), preferably a shallow trench isolation (STI) region. As is well known, there are many processes that can be used to form the STI, so the process need not be described here in detail. In general, STI includes a shallow trench that is etched into the surface of the semiconductor layer 24 that is subsequently filled with an insulating material. After the trench is filled with an insulating material, such as an oxide, the surface is usually planarized, for example by chemical mechanical planarization (CMP).

A layer of gate insulating material 53 is formed at the surface of the impurity-doped regions and gate electrodes 70 are formed overlying the gate insulating material 53 and impurity-doped N-well region 62, respectively. The layer of gate insulating material 53 can be a layer of thermally grown silicon dioxide or, alternatively, a deposited insulator such as silicon oxide, silicon nitride, or a high dielectric constant ($\kappa$) insulator material having a high dielectric constant ($\kappa$) relative to silicon dioxide. Examples of "high-$\kappa$ dielectric" materials include hafnium and zirconium silicates, and their oxides, including, but not limited to, hafnium oxide ($HfO_2$), hafnium silicate (HfSiO), or the like. Deposited insulators can be deposited, for example, by chemical vapor deposition (CVD), low pressure chemical vapor deposition (LPCVD), or plasma enhanced chemical vapor deposition (PECVD). High dielectric constant ($\kappa$) insulator materials are typically deposited using atomic layer deposition (ALD). The deposited gate insulator layer 53 preferably has a thickness of about 1-10 nm, although the actual thickness can be determined based on the circuit being implemented.

Gate electrode 70 is preferably formed by depositing, patterning, and etching a layer of metal or polycrystalline silicon, preferably a layer of undoped polycrystalline silicon. The gate electrode 70 is formed over the N-well region 62 in the semiconductor layer 24 and generally have a thickness of about 100-300 nm. The polycrystalline silicon can be deposited, for example, by the reduction of silane ($SiH_4$) in a CVD reaction such as a low pressure chemical vapor deposition (LPCVD).

The PMOS transistor 30 is electrically isolated from other transistors (not shown) by a dielectric isolation region 37, preferably a shallow trench isolation (STI) region. As is well known, there are many processes that can be used to form the STI, so the process need not be described here in detail. In general, STI includes a shallow trench that is etched into the surface of the semiconductor substrate 22 and that is subsequently filled with an insulating material. After the trench is filled with an insulating material such as silicon oxide, the surface is usually planarized, for example by chemical mechanical planarization (CMP).

Sidewall spacers 38 are formed on the sidewalls of gate electrodes 70. The sidewall spacers 38 are formed by depositing a layer of insulating material such as silicon oxide and/or silicon nitride and subsequently anisotropically etching the insulating layer, for example by reactive ion etching (RIE). Silicon oxide and silicon nitride can be etched, for example, in a $CHF_3$, $CF_4$, or $SF_6$ chemistry.

A layer of masking material, which can be, for example, a layer of photoresist, is applied and patterned to expose the PMOS transistor structure 30. Using this layer of patterned mask material as an ion implantation mask, P-type conductivity determining ions such as boron ions are implanted into: the N-well portion 62 of the silicon substrate to form P-type source 42 and drain 44 regions in the substrate 24 and into gate electrode 70 to conductivity dope that gate electrode 70 with P-type impurities. Although not shown, the patterned layer of masking material is removed and another layer of masking material, again a layer such as a layer of photoresist, is applied and is patterned, for example, to mask the PMOS transistor structures 30 and to expose NMOS transistor structure(s) (not shown). Using the patterned masking material as an ion implantation mask, N-type conductivity determining ions are implanted into: a P-type portion (not shown) of the substrate 24 to form N-type source and drain regions in the substrate 24, and into gate electrode (not shown) to conductivity dope that gate electrode (not shown) with N-type impurities. The implanted ions can be either phosphorus or arsenic ions. For each of the transistor structures, the ion-implanted source and drain regions are self aligned with the gate electrodes. As those of skill in the art will appreciate, additional sidewall spacers and additional implantations may be employed to create drain extensions, halo implants, deep source and drains, and the like. It will also be appreciated by those skilled in the art that the order of forming the source and drain regions of the N-channel and the P-channel MOS transistors can be reversed.

At the stage of processing shown in FIG. 1, the semiconductor substrate 24 comprises a plurality of active S/D regions 42, 44 and a gate electrode structure 38, 53, 70 formed thereon. Each of the gate electrode structure comprises a gate insulator layer 53, a gate electrode 70 overlying the gate insulator layer 53, and spacers 38 adjacent a first sidewall and a second sidewall of the gate electrode 70. The gate electrode structure 38, 53, 70 has a height of approximately 100 nm, and a width of approximately 40 nm or less. The spacing or "pitch" between adjacent gate electrodes is approximately 190 nm. The close "pitch" or distance between adjacent gate electrodes 70 makes it difficult if not impossible to use conventional photolithography techniques to fit contact holes to the active S/D regions 42, 44 of each transistor. As such, techniques are needed which allow contact holes (and eventual contacts) to be squeezed in the available space between gate electrodes.

Figure 2:
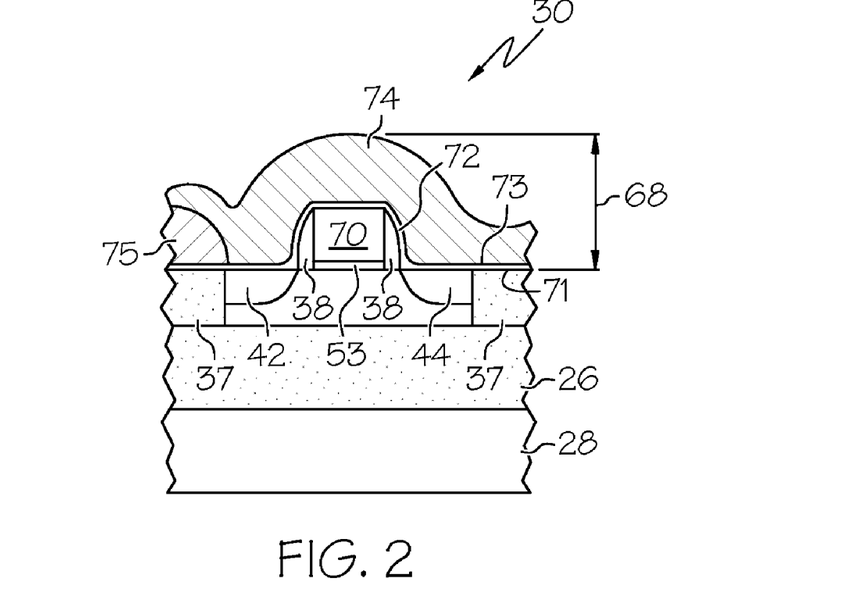

As illustrated in FIG. 2, an oxide liner layer 72 is deposited over the structure shown in FIG. 1. The oxide liner layer 72 comprises a lower surface 71 and an upper surface 73. In an exemplary embodiment, the oxide liner layer 72 is an oxide film deposited by chemical vapor deposition (CVD) or physical vapor deposition (PVD). The oxide liner layer 72 is deposited to a thickness that provides a uniform and continuous layer, without a significant presence of pinholes or other defects. In an exemplary embodiment, the oxide liner layer 72 is deposited to a thickness of about 1 nm to about 5 nm.

Appropriate stress liner layers 74, 75 for a given transistor conductivity type are deposited over the upper surface 73 of the oxide liner layer 72. Preferably a tensile stress liner layer is deposited overlying NMOS transistor(s) (not shown) and, as illustrated in FIG. 2, a compressive stress liner layer is deposited overlying PMOS transistor 30. The deposition conditions, reactants, and reactant flows can be adjusted, as is well known, to deposit either a tensile stress liner or a compressive stress liner. In accordance with the embodiment illustrated in FIG. 2, the compressive stress liner layer 74 is blanket deposited, to overlie the oxide liner layer 72, to a thickness between 20 nm and 150 nm, and approximately 30 nm is some embodiments. The compressive stress liner layer 74 is formed of an appropriate electrically insulating material, such as, a layer of stressed silicon nitride (SiN). The layer of SiN can be deposited, for example, by LPCVD or PECVD from reactants including dichlorosilane and ammonia. The compressive stress liner layer 74 is patterned to remove portions which overlie the NMOS transistor(s).

Figure 3:
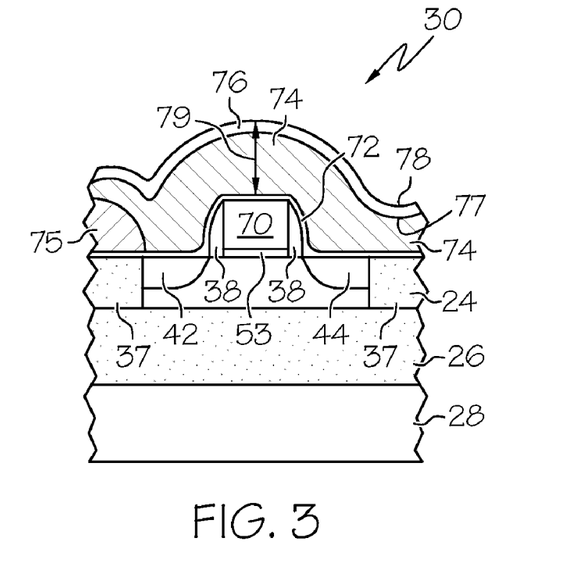

As illustrated in FIG. 3, an etch stop layer 76 is conformally blanket deposited over the stress liner layer 74, 75. The etch stop layer 76 has an upper surface 78 and a bottom surface 77. The etch stop layer 76 can be, for example, an oxide-based material such as silicon dioxide ($SiO_2$). The etch stop layer 76 can be deposited using techniques such as by chemical vapor deposition (CVD) or physical vapor deposition (PVD) to an appropriate thickness which depends on subsequent processing steps including a plasma etching step. In some embodiments the thickness is approximately 5 nm. The combined thickness 79 of the compressive stress liner layer 74 and the etch stop layer 76 is the distance between the bottom surface 73 of the compressive stress liner layer 74 and the upper surface 78 of the etch stop layer 76. The combined thickness of the compressive stress liner layer 74 and the etch stop layer 76 is substantially uniform throughout as illustrated by double-headed arrow 79.

Figure 4:
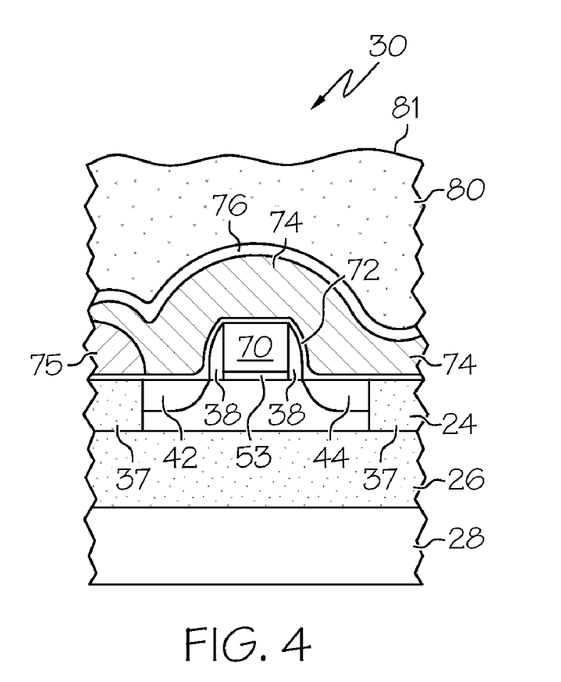

As illustrated in FIG. 4, a low dielectric constant (κ) dielectric film layer 80 is blanket deposited over the upper surface 78 of the etch stop layer 76. The low κ dielectric film layer 80 has an upper surface 81, and in some embodiments has a dielectric constant, for example, between 2.7 and 4.5. The thickness of the low κ dielectric film layer 80 is slightly greater than the height of contacts 99 that will eventually be formed to contact regions (not shown) for the gate electrode 70 and the active regions 42, 44. In one embodiment, the low κ dielectric film layer 80 may comprise a silicon nitride film layer which can be deposited, for example, by PECVD from the reaction of dichlorosilane and ammonia. Those of skill in the art will understand that other dielectric materials other than silicon nitride, such as oxide-based materials or carbide-based materials, can be deposited.

Figure 5:
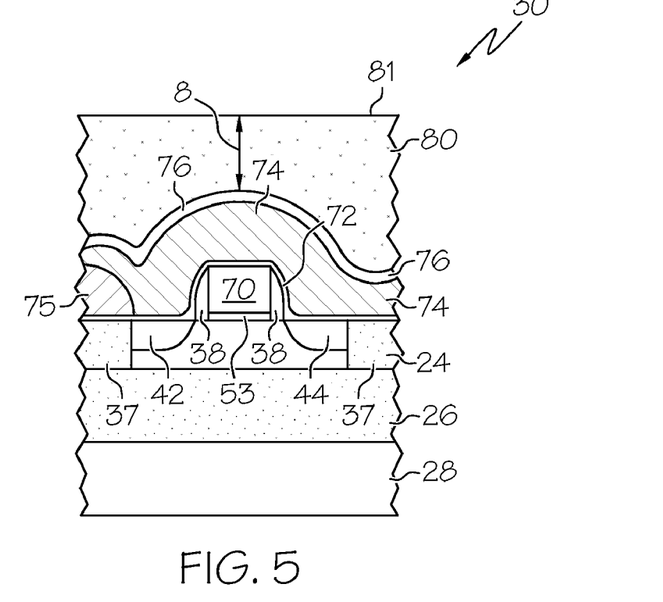

In accordance with one embodiment illustrated in FIG. 5, the upper surface 81 of the low κ dielectric film layer 80 can optionally be polished to remove topographically irregular portions of the low κ dielectric film layer 80 and create a planar upper surface 81 and make the topography of the upper surface 81 of the low κ dielectric film layer 80 substantially uniform. The upper surface 81 of the low κ dielectric film layer 80 can be polished using, for example, chemical mechanical polishing (CMP). The thickness of the low κ dielectric film layer 80 is the distance between the upper surface 81 of the low κ dielectric film layer 80 and the upper surface 78 of the etch stop layer 76. The thickness of the low κ dielectric film layer 80 is non-uniform and varies throughout the low κ dielectric film layer 80 as illustrated by double-headed arrow 8. In one embodiment, the thickness of the low κ dielectric film layer 80 in the region shown by the double-headed arrow 8 is between approximately 100 nm to 250 nm.

Notably, the materials used for the low κ dielectric film layer 80 and the etch stop layer 76 are selected such that they can be etched selectively with respect to one another so that etching selectively stops at the upper surface 78 of the etch stop layer 76. This allows etching to take place using multiple etching steps so that contact holes can eventually be etched which have a substantially vertical etch profile, and which can selectively stop at different depths to reach contact regions located at different heights. For example, in the embodiments that will be described below, the low κ dielectric film layer 80 can be wet etched in a solution of hot phosphoric acid ($H_3PO_4$) such that etching selectively stops at the upper surface 78 of the etch stop layer 76. An anisotropic reactive ion etching (RIE) process can be used to etch through the exposed or uncovered portions of the etch stop layer 76, portions of the stress liner layer 74 and the portions of the liner layer 72 which underlie the exposed portions of the etch stop layer 76 to expose contact points or regions. The use of wet etching followed by reactive ion etching to form the contact holes 194 allows the etching profile to be controlled and allows for steeper contact hole profiles to be achieved without changing the etched profile of the resultant contact hole.

Figure 6:
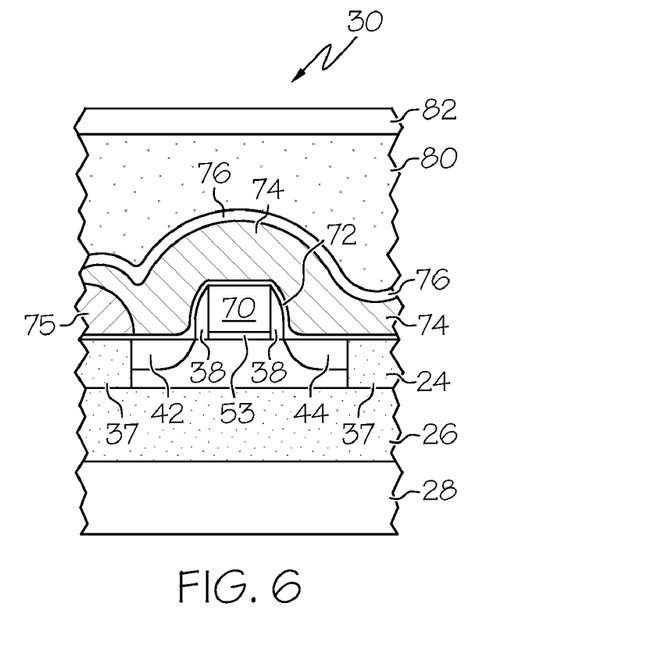

As illustrated in FIG. 6, a thin capping layer 82 can optionally be deposited on the polished upper surface 81 of the low κ dielectric film layer 80 to prevent photoresist poisoning during subsequent processing steps. The capping layer 82 is an anti-reflective coating (ARC) layer which absorbs light to prevent reflections during photolithographic processing over metal or other reflective materials. The capping layer 82 material and thickness are selected based on the material being patterned and the wavelength of the exposing radiation. In one embodiment, the capping layer 82 may comprise, for example, an organic-based material, and can be deposited to a thickness between 80 nm to 100 nm. With the capping layer 82 in place, photoresist can be exposed with minimal reflection from the reflective material.

A layer of photosensitive material (not shown in FIG. 6), such as a layer of photoresist, is applied to the upper surface 81 of the low κ dielectric film layer 80 or optionally to the surface of the capping layer 82 if present. As is well known to those of skill in the art, adhesion promoters (not illustrated) and/or antireflective coatings may be applied to the polished upper surface 81 of the low κ dielectric film layer 80 before the photosensitive material is applied. Photosensitive material can be selected from the well known and commercially available photoresist materials, and can be applied on the surface of the upper surface 81 of the low κ dielectric film layer 80 or optionally to the surface of the capping layer 82 if present, using spin coating techniques.

Figure 7:
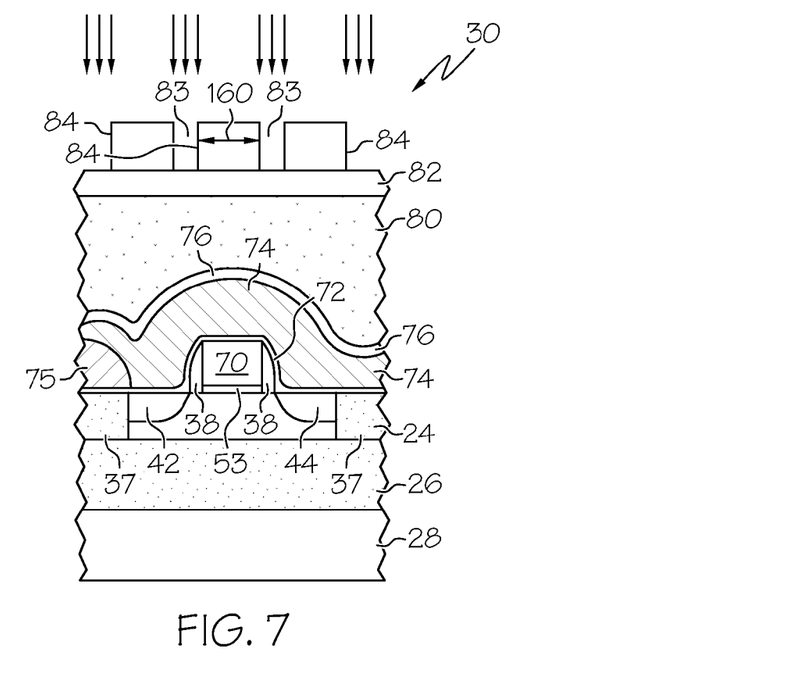

As illustrated in FIG. 7, the photosensitive material is patterned using photolithography methods to form photoresist structures 84. To form the photoresist structures 84, in one embodiment, a lithographic contact mask (not shown) is provided with a pattern of non-transparent round disks formed thereon which block the passage of light; the transparent round disks have a diameter of approximately 100 nm. The pattern of the non-transparent disks on the lithographic contact mask correspond roughly to the negative of the eventual contact holes that are to be formed. During an exposure step, the areas of the photoresist layer are exposed to radiation that passes through the lithographic contact mask and destabilizes those areas exposed to the radiation. The majority of the photoresist layer (which is not covered or shielded by dark portions the lithographic contact mask) is washed off during a developing step. As a result, the remaining portions 84 of the photoresist layer (or "photoresist structures" 84) comprise a number of small photoresist structures 84 which overlie and roughly correspond to the desired location of contact holes that are to eventually be formed. The photoresist structures 84 preferably have a critical lateral dimension (as shown by double-headed arrow 160) that is greater than a critical lateral dimension (as shown by double-headed arrow 150) of the future contact holes 94 that will eventually be fabricated.

For example, in one embodiment, a layer of photoresist can be patterned to leave remaining portions 84 of the photoresist layer (e.g., photoresist structures 84) which overlie and overlap eventual contact holes 194 to contact regions (not shown) for the gate electrode 70 and the active regions 42, 44. In other words, the remaining photoresist structures 84 are aligned over the eventual contact holes 194 to contact regions (not shown) for the gate electrode 70 and the active regions 42, 44. While FIG. 7 illustrates three photoresist structures 84 overlying the capping layer 82, it will be appreciated that one or any other number of photoresist structures 84 can be formed depending on the number of contacts to be formed. Notably, the lateral dimension (as shown by double-headed arrow 160) of photoresist structures 84 is initially greater than a desired "critical dimension (CD)" (as shown by double-headed arrow 150 in FIG. 8) of the eventual contacts 99 that will be formed. In one embodiment, the photoresist structures 84 initially have a lateral dimension (as shown by double-headed arrow 160) of between 75 nm and 80 nm.

Figure 8:
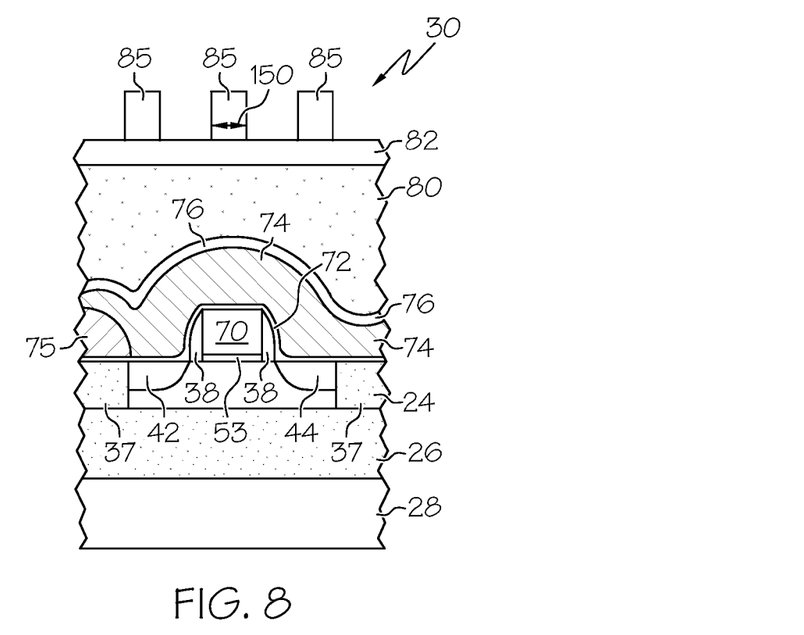

As illustrated in FIG. 8, the method continues with the lateral "trimming" of photoresist structures 84 (the trimmed photoresist structures 85 are illustrated in FIG. 7 with dotted lines). As used herein, the term "trimming" refers to an etching step used to reduce or shrink a lateral dimension (as shown by double-headed arrow 160) of a photoresist feature. Trimming can achieved with an isotropic etching process that is a wet etch or, preferably, a dry isotropic etch such as, for example, an oxygen-based plasma etch. As used herein, the term "isotropic etching" refers to non-directional removal of material via a chemical process using an etchant such as a corrosive liquid or plasma (e.g., chemically active ionized gas). Each of the photoresist structures 84 are trimmed so that their respective lateral dimension or width (as shown by double-headed arrow 160) is reduced to approximately the same as a lateral dimension (as shown by double-headed arrow 150) of the eventual contact holes 194 that will eventually be etched through intermediate layers to contact regions (e.g., polysilicon gate material that is formed over a portion of the gate electrode) for the gate electrode 70 and the active regions 42, 44. In the particular embodiment shown in FIG. 8, the intermediate layers comprise liner layer 72, stress liner layer 74, etch stop layer 76, low κ dielectric film layer 80, and capping layer 82; however, one of ordinary skill in the semiconductor arts will appreciate that either fewer or more intermediate layers could be present. The present invention applies equally in either of those scenarios. The lateral dimension (as shown by double-headed arrow 150 in FIG. 8) of the trimmed photoresist structures 85 is approximately equal to a desired "critical dimension (CD)" of the eventual contacts 99 that will be formed. In one embodiment, the trimmed photoresist structures 85 have a diameter or lateral dimension (as shown by double-headed arrow 150 of FIG. 8) of between 40 nm and 50 nm. Uncovered portions of the capping layer 82 are exposed around and between the trimmed photoresist structures 85.

Figure 9:
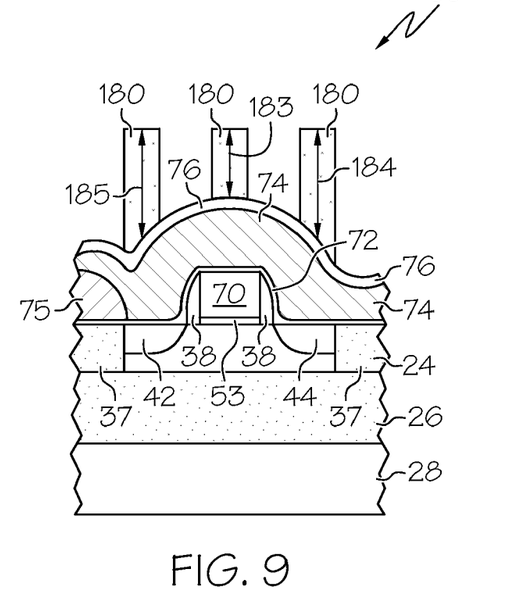

As illustrated in FIG. 9, the exposed portions of the capping layer 82 and portions of the low κ dielectric film layer 80 underlying the exposed portions of the capping layer 82 are etched in one direction using the trimmed photoresist structures 85 as an etch mask. Portions of the capping layer 82 and low κ dielectric film layer 80 between and around the pillars or plugs 86 are etched, for example, using anisotropic etching techniques such as reactive ion etching (RIE) techniques. The etching selectively stops at the upper surface 78 of the etch stop layer 76. The trimmed photoresist structures 85 and remaining portions of the capping layer 82 underlying the trimmed photoresist structures 85 are also removed during the etching such that sacrificial plugs 180 of the low κ dielectric film layer 80 remain. The sacrificial plugs 180 which result from this etching step results have substantially vertical sidewalls, and the respective heights 183, 184, 185 of the sacrificial plugs 180 vary as illustrated by double-headed arrows 183, 184, 185.

Figure 10:
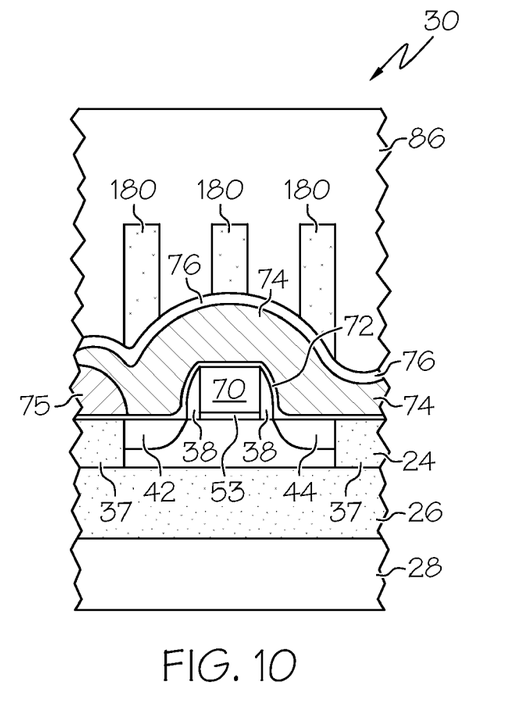

As illustrated in FIG. 10, an interlevel dielectic (ILD) layer 86 is deposited over remaining sacrificial plug portions 180 of the low κ dielectric film layer 80 so that the remaining sacrificial plug portions 180 are embedded in the ILD layer 86. The ILD layer 86 comprises an oxide-based material such as silicon dioxide ($SiO_2$). The ILD layer 86 can be deposited to a thickness greater than the height of the remaining sacrificial plug portions 180.

Figure 11:
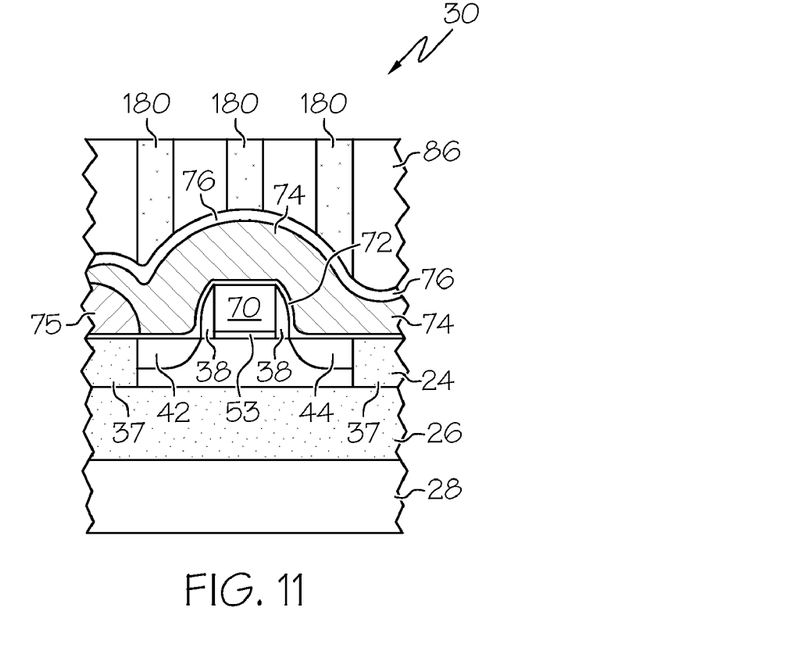

As illustrated in FIG. 11, the ILD layer 86 is polished to remove portions of the ILD layer 86 to planarize the ILD layer 86 and to expose the remaining sacrificial plug portions 180. The ILD layer 86 can be polished down to a thickness of approximately 100 nm using a chemical mechanical planarization (CMP) process.

Figure 12:
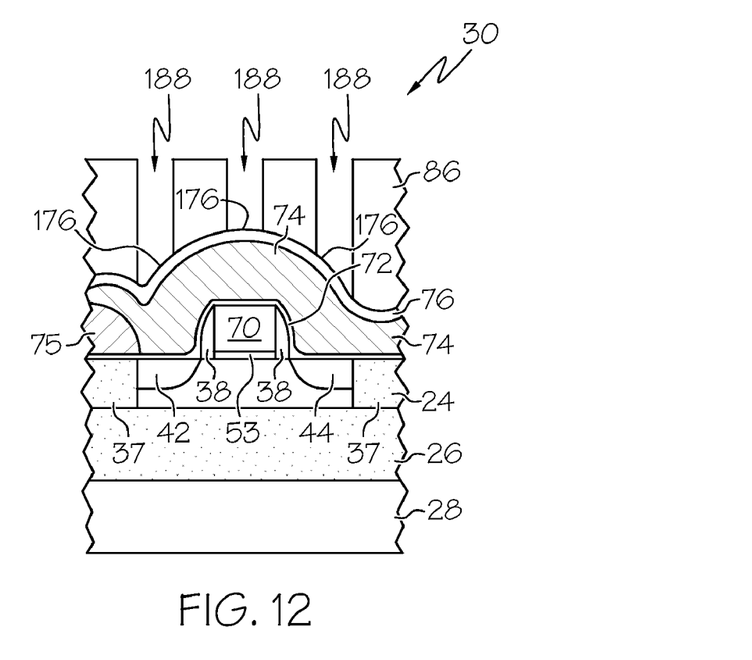

As illustrated in FIG. 12, the remaining sacrificial plug portions 180 of the low κ dielectric film layer 80 are removed to form holes 188 through the ILD layer 86. The remaining sacrificial plug portions 180 of the low κ dielectric film layer 80 are sacrificial elements or pillars that are formed from a different material than the ILD layer 86. Because the remaining sacrificial plug portions 180 are formed from a different material than the ILD layer 86 the remaining sacrificial plug portions 180 can be selectively etched with respect to the ILD layer 86 without changing the etched profile of the resultant contact hole 188. The holes 188 are aligned over exposed portions of the upper surface 78 of the etch stop layer 76. As noted above, the holes 188 have a diameter or lateral dimension equal to the diameter or lateral dimension of the trimmed photoresist structures 85. The remaining sacrificial plug portions 180 can be removed by any one of a number of etching techniques to expose selected portions 176 of the oxide etch stop layer 76. For example, in one embodiment where the low κ dielectric film layer 80 comprises SiN and the remaining sacrificial plug portions 180 comprise silicon nitride (SiN) plugs or pillars 180, the silicon nitride (SiN) sacrificial plugs 180 can be wet etched in a solution of hot phosphoric acid ($H_3PO_4$).

Figure 13:
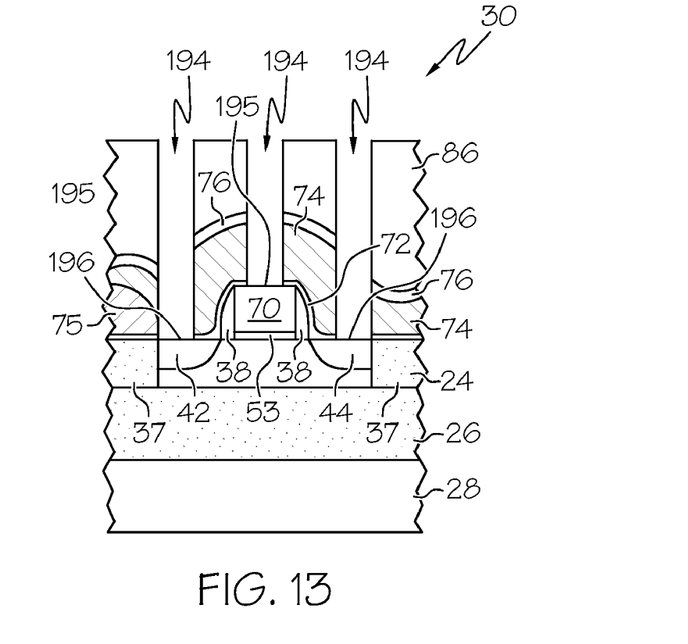

As illustrated in FIG. 13, an anisotropic reactive ion etching (RIE) process can be used to etch through the exposed or uncovered portions 176 of the etch stop layer 76, portions of the stress liner layer 74 and the portions of the liner layer 72 which underlie the exposed portions 176 of the etch stop layer 76 to expose contact points or regions 195. The anisotropic RIE step defines contact holes 194 overlying contact regions 195 of the gate electrode 70 and contact regions 196 of the active S/D regions 42, 44 of the semiconductor substrate 24. Etchants used in the RIE step are selected such that etching selectively stops upon reaching the substrate 24 after etching through the liner layer 72. For example, in the embodiment shown in FIG. 13, when the etch stop layer 76 is an oxide, the stress liner layer 74 is SiN, and liner layer 72 is an oxide, the etchants are selected to etch through these layers and stop upon reaching the substrate 24. Examples of suitable plasma etchants include, but are not limited to, Difluoromethane ($CH_2F_2$), Tetrafluoromethane (CH4), Hydrogen Bromide (HBr). During the RIE process some of the thickness of the ILD layer 86 will be sacrificed. The above-described use of wet etching followed by reactive ion etching to form the contact holes 194 allows the etching profile to be controlled and allows for steeper contact profiles to be achieved.

Figure 14:
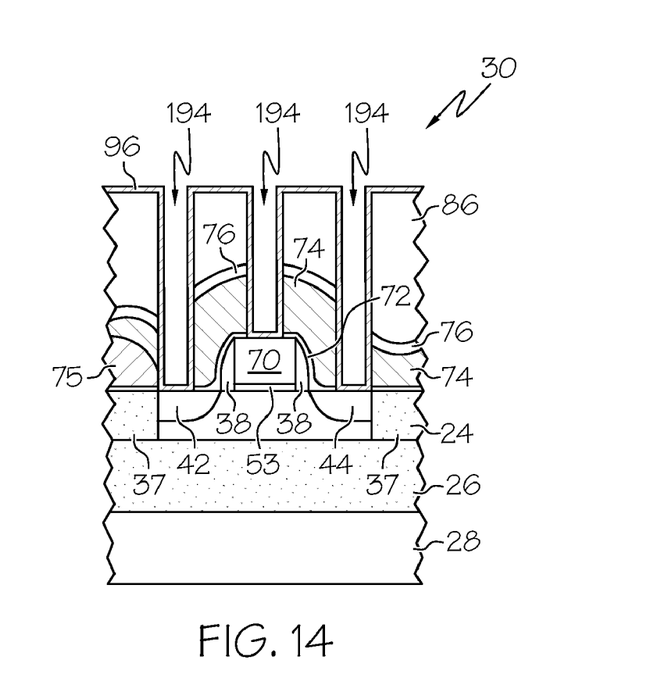
Figure 15:
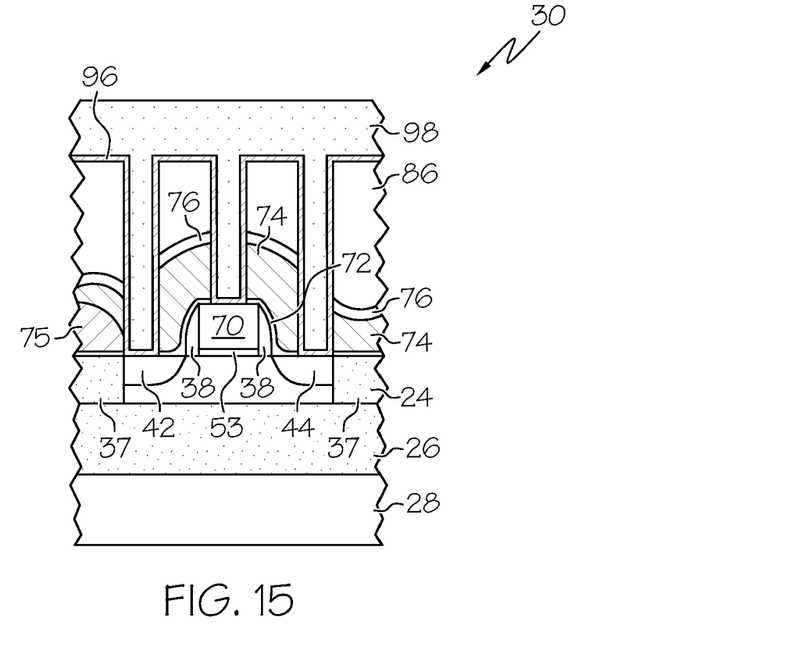
Figure 16:
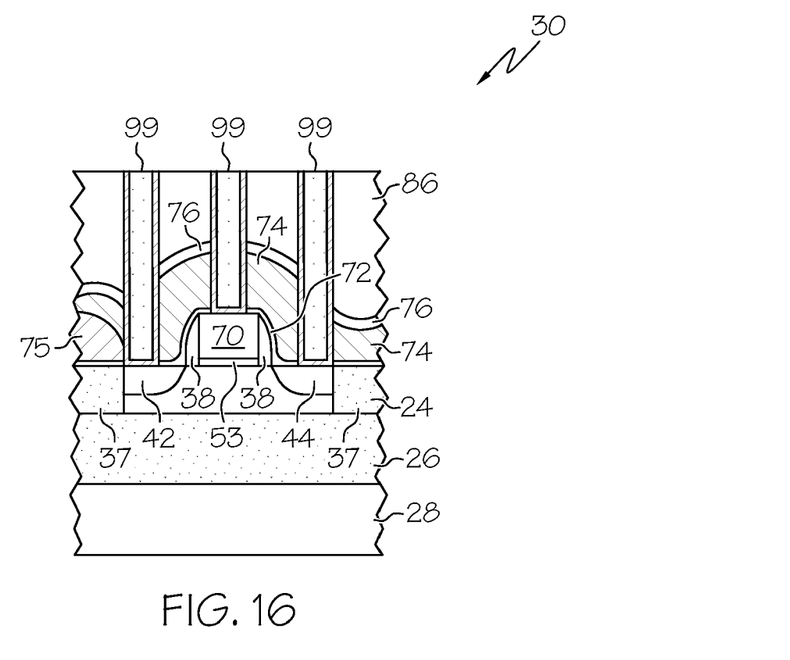

As illustrated in FIGS. 14-16, contacts 99 can be formed in the contact holes 194 to contact regions 195 over the gate electrode 70 and to the contact regions 196 the active regions 42, 44 of the semiconductor substrate 24. As illustrated in FIG. 14, a baffler liner layer 96 is optionally deposited over the remaining portions of the ILD layer 86 and to line the contact holes 94 with the barrier metal. Exemplary barrier materials which can be used include, for example, tantalum nitride and titanium nitride.

As illustrated in FIG. 15, a conductive layer 98 is blanket deposited in the lined contact holes 194 and overlying the remaining portions of the ILD layer 86 until the lined contact holes 194 are filled. In the illustration of FIG. 15, the conductive layer 98 significantly overfills the lined contact holes 194; however, this is not the case in all embodiments. The conductive layer 98 can be deposited using conventional methods such as, for example, PVD, CVD, ALD, or electroplating. The conductive material can be a metal such as, for example, tungsten, copper, or the like, or alloys of any metal, or can be any other conductive material such as doped silicon.

As illustrated in FIG. 16, any excess portions of the conductive layer 98, which overlie the barrier metal liner layer 96 and/or the ILD layer 86, can be removed by etching or by chemical-mechanical polishing (CMP) until a surface of ILD layer 86 is exposed or until a desired thickness of the conductive material 98 in the contact holes 194 is realized. In one embodiment, the conductive layer 98 comprises a copper-based material, and the barrier metal liner layer 96 may comprise any high electrical conductivity metal that can maintain a good electronic contact, while maintaining a low enough copper diffusivity to chemically isolate the copper conductor from the silicon below barrier metal liner layer 96.

After the excess portions of the conductive layer 98 have been removed, the remaining portions of the conductive layer comprise the contacts 99 to contact regions (not shown) for the gate electrode 70 and the active regions 42, 44 of the semiconductor substrate 24.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor device, the method comprising the steps of:
   providing a structure on and in a semiconductor substrate, wherein the structure comprises: a first contact point and a second contact point disposed in a plane above the first contact point, a first material layer overlying an upper surface of the semiconductor substrate and the first contact point, and a second material layer overlying the first material layer;
   applying a photoresist layer over the second material layer, patterning the photoresist layer to leave remaining portions of the photoresist layer, and trimming the remaining portions of the photoresist layer to produce trimmed remaining portions of the photoresist layer which overlie the first contact point, and the second contact point and to expose portions of the second material layer;
   etching away exposed portions of the second material layer using the trimmed remaining portions of the photoresist layer as an etch mask to form sacrificial plugs comprising remaining portions of the second material layer;
   depositing an interlevel dielectric (ILD) layer comprising oxide over the sacrificial plugs and the remaining portions of the second material layer;
   polishing the ILD layer to remove portions of the ILD layer over the sacrificial plugs and the remaining portions of the second material layer;
   etching through the sacrificial plugs to form first contact holes that reach portions of the first material layer; and
   etching through portions of the first material layer to extend the first contact holes to produce final contact holes which extend to the first contact point and the second contact point.

2. A method according to claim 1, wherein a thickness of the first material layer is substantially uniform, wherein an upper surface of the first material layer has a non-uniform height which varies with respect to the upper surface of the semiconductor substrate,
   wherein a thickness of the second material layer is non-uniform such that a combined thickness of the first material layer and the second material layer varies with respect to the upper surface of the semiconductor substrate,
   wherein respective heights of at least some of the sacrificial plugs are different, and
   wherein respective heights of at least some of the final contact holes are different and wherein the final contact holes have a substantially uniform lateral dimension.

3. A method for fabricating a semiconductor device, the method comprising the steps of:
   providing a semiconductor substrate having an upper surface;
   forming a source region and a drain region in the semiconductor substrate, wherein the source region has a first contact point and wherein the drain region has a second contact point;
   forming a gate structure on the semiconductor substrate having a third contact point disposed in a plane above the first contact point and the second contact point, wherein the gate structure comprises: a gate electrode;
   conformally depositing a liner layer over the semiconductor substrate;
   conformally depositing a stress liner layer over the liner layer;
   conformally blanket depositing an etch stop layer over the stress liner layer, wherein the etch stop layer has an upper surface;
   blanket depositing a dielectric layer over the etch stop layer, wherein the dielectric layer has an upper surface;
   polishing the upper surface of the dielectric layer;
   depositing a capping layer on the polished upper surface of the dielectric layer;
   applying a photoresist layer over the capping layer;
   patterning the photoresist layer to expose portions of the capping layer and to leave remaining portions of the photoresist layer, wherein the remaining portions of the photoresist layer have a first lateral dimension and overlie the final contact holes to the first contact point, the second contact point, and the third contact point;
   trimming the remaining portions of the photoresist layer to produce trimmed remaining portions of the photoresist layer which overlie the final contact holes to the first contact point, the second contact point, and the third contact point;

etching away exposed portions of the capping layer and portions of the dielectric layer underlying the exposed portions of the capping layer that are adjacent to the trimmed remaining portions of the photoresist layer using the trimmed remaining portions of the photoresist layer as an etch mask to form sacrificial plugs, wherein the sacrificial plugs comprise remaining portions of the dielectric layer which remain after etching away exposed portions of the capping layer and the portions of the dielectric layer underlying the exposed portions of the capping layer;

depositing an interlevel dielectric (ILD) layer over the sacrificial plugs;

polishing the ILD layer to remove portions of the ILD layer over the sacrificial plugs;

etching through the sacrificial plugs to form first contact holes that expose portions of the etch stop layer, wherein the etching selectively stops at the upper surface of the etch stop layer; and etching through exposed portions of the etch stop layer, portions of the stress liner layer underlying the exposed portions of the etch stop layer, and portions of the liner layer to extend the first contact holes to produce final contact holes which extend to the first contact point, the second contact point, and the third contact point.

4. A method according to claim 3, wherein the step of trimming the remaining portions of the photoresist layer comprises the step of:

trimming the remaining portions of the photoresist layer which overlie final contact holes to the first contact point, the second contact point, and the third contact point to reduce the first lateral dimension of the remaining portions of the photoresist layer to produce trimmed remaining portions of the photoresist layer having a second lateral dimension that is less than the first lateral dimension.

5. A method according to claim 4, wherein the step of trimming the remaining portions of the photoresist layer, comprises the step of:

etching the remaining portions of the photoresist layer which overlie final contact holes to the first contact point, the second contact point, and the third contact point to reduce the first lateral dimension of the remaining portions of the photoresist layer to produce trimmed remaining portions having a second lateral dimension that is less than the first lateral dimension.

6. A method according to claim 5, wherein the step of etching the remaining portions of the photoresist layer which overlie final contact holes, comprises the step of:

isotropically etching the remaining portions of the photoresist layer which overlie final contact holes to the first contact point, the second contact point, and the third contact point to reduce the first lateral dimension of the remaining portions of the photoresist layer to produce trimmed remaining portions having a second lateral dimension that is less than the first lateral dimension.

7. A method according to claim 3, wherein the step of etching through exposed portions of the etch stop layer, portions of the stress liner layer underlying the exposed portions of the etch stop layer, and the liner layer to extend the first contact holes to produce final contact holes which extend to the first contact point, the second contact point, and the third contact point, comprises the step of:

reactive ion etching through the exposed portions of the etch stop layer, portions of the stress liner layer underlying the exposed portions of the etch stop layer, and the liner layer to define final contact holes which extend to the first contact point, the second contact point, and the third contact point, wherein the reactive ion etching step selectively stops after etching through the liner layer.

8. A method according to claim 3, further comprising the step of:

forming contacts in the final contact holes.

9. A method according to claim 8, wherein the step of forming contacts in the final contact holes comprises the steps of:

depositing a barrier metal liner layer in the final contact holes;

depositing a conductive layer over the baffler metal liner layer in the final contact holes and over the remaining portions of the ILD layer; and chemical-mechanical polishing (CMP) the conductive layer to planarize the conductive layer and remove portions of the conductive layer overlying the remaining portions of the ILD layer, wherein the remaining portions of the conductive layer comprise the contacts which extend to the first contact point, the second contact point, and the third contact point.

10. A method according to claim 3, wherein a thickness of the etch stop layer is substantially uniform, wherein the upper surface of the etch stop layer has a non-uniform height which varies with respect to the upper surface of the semiconductor substrate, wherein a thickness of the dielectric layer is non-uniform such that a combined thickness of the etch stop layer and the dielectric layer varies with respect to the upper surface of the semiconductor substrate, wherein respective heights of at least some of the sacrificial plugs are different, and wherein respective heights of at least some of the final contact holes are different and wherein the final contact holes have a substantially uniform lateral dimension.

11. A method for fabricating a semiconductor device, the method comprising the steps of:

providing a semiconductor substrate;

forming a source region and a drain region in the semiconductor substrate;

forming a gate structure on the semiconductor substrate, wherein the gate structure comprises: a gate electrode disposed above the source region and the drain region;

depositing a liner layer over the semiconductor substrate, wherein the liner layer comprises a lower surface and an upper surface;

depositing a stress liner layer over the liner layer;

conformally blanket depositing an etch stop layer over the stress liner layer, wherein the etch stop layer has an upper surface;

blanket depositing a dielectric layer over the etch stop layer, wherein the dielectric layer has an upper surface;

polishing the upper surface of the dielectric layer;

depositing a capping layer on the polished upper surface of the dielectric layer;

applying a photoresist layer over the capping layer;

patterning the photoresist layer to expose portions of the capping layer and to leave remaining portions of the photoresist layer, wherein the remaining portions of the photoresist layer have a first lateral dimension and overlie eventual contact holes to contact regions for the gate electrode, the source region and the drain region;

isotropically etching the remaining portions of the photoresist layer which overlie the eventual contact holes to contact regions for the gate electrode, the source region and the drain region to reduce the first lateral dimension of the remaining portions of the photoresist layer to produce trimmed remaining portions having a second lateral dimension that is less than the first lateral dimension and to expose portions of the capping layer;

etching exposed portions of the capping layer and portions of the dielectric layer underlying the exposed portions of the capping layer, the exposed portions of the capping layer being adjacent to the trimmed remaining portions of the photoresist layer, wherein the etching selectively stops at the upper surface of the etch stop layer;

removing the trimmed remaining portions of patterned photoresist layer and remaining portions of the capping layer which underlie the trimmed remaining portions of patterned photoresist layer such that portions of the dielectric layer remain;

depositing an interlevel dielectric (ILD) layer comprising oxide over the remaining portions of the dielectric layer;

polishing the ILD layer to remove portions of the ILD layer over the remaining portions of the dielectric layer; and etching away remaining portions of the dielectric layer to expose exposed portions of the etch stop layer.

12. A method according to claim 11, further comprising the steps of:

reactive ion etching through the exposed portions of the etch stop layer and portions of the stress liner layer underlying the exposed portions of the etch stop layer to define contact holes to contact regions for the gate electrode, the source region and the drain region, wherein the reactive ion etching step selectively stops after etching through the liner layer.

13. A method according to claim 12, further comprising the step of:

forming contacts in the contact holes to contact regions for the gate electrode, the source region and the drain region.

14. A method according to claim 13, wherein the step of forming contacts comprises the steps of:

depositing a barrier metal liner layer in the contact holes to contact regions for the gate electrode, the source region and the drain region to line the contact holes;

depositing a conductive layer on the barrier metal liner layer in the contact holes and over remaining portions of the ILD layer; and chemical-mechanical polishing (CMP) the conductive layer to planarize the conductive layer and remove portions of the conductive layer overlying the remaining portions of the ILD layer, wherein the remaining portions of the conductive layer after the CMP comprise the contacts to contact regions for the gate electrode, the source region and the drain region.

15. A method for fabricating a semiconductor device, the method comprising the steps of:

providing a semiconductor substrate having an upper surface, a gate structure on the semiconductor substrate, and a source region and a drain region in the semiconductor substrate, wherein the source region has a first contact point and wherein the drain region has a second contact point, and wherein the gate structure has a third contact point disposed in a plane above the first contact point and the second contact point;

conformally blanket depositing an etch stop layer overlying the upper surface of semiconductor substrate and the gate structure, wherein the etch stop layer has an upper surface;

depositing at least one second material layer overlying the upper surface of the etch stop layer;

applying a photoresist layer over the at least one second material layer, and patterning the photoresist layer to leave remaining portions of the photoresist layer;

trimming the remaining portions of the photoresist layer to produce trimmed remaining portions of the photoresist layer which overlie eventual contact holes to the first contact point, the second contact point, and the third contact point to expose portions of the at least one second material layer;

etching away exposed portions of the at least one second material layer using the trimmed remaining portions of the photoresist layer as an etch mask to form sacrificial plugs comprising remaining portions of the at least one second material layer which remain after etching away exposed portions of the at least one second material layer;

depositing an interlevel dielectric (ILD) layer over the sacrificial plugs, and polishing the ILD layer to remove portions of the ILD layer over the sacrificial plugs;

etching away the sacrificial plugs to expose exposed portions of the etch stop layer, wherein the etching selectively stops at the upper surface of the etch stop layer; and etching through portions of the etch stop layer to produce final contact holes which extend to the first contact point, the second contact point, and the third contact point.

* * * * *